(12) United States Patent
Dannenberg et al.

(10) Patent No.: US 11,208,319 B2
(45) Date of Patent: Dec. 28, 2021

(54) METHOD FOR MANUFACTURING A MEMS UNIT FOR A MICROMECHANICAL PRESSURE SENSOR

(71) Applicant: Robert Bosch GmbH, Stuttgart (DE)

(72) Inventors: Arne Dannenberg, Metzingen (DE); Joachim Fritz, Tuebingen (DE); Thomas Friedrich, Moessingen-Oeschingen (DE); Torsten Kramer, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/489,614

(22) PCT Filed: Feb. 13, 2018

(86) PCT No.: PCT/EP2018/053556
§ 371 (c)(1),
(2) Date: Aug. 28, 2019

(87) PCT Pub. No.: WO2018/162188
PCT Pub. Date: Sep. 13, 2018

(65) Prior Publication Data
US 2020/0024133 A1    Jan. 23, 2020

(30) Foreign Application Priority Data
Mar. 9, 2017   (DE) .......................... 102017203919.1

(51) Int. Cl.
*B81B 7/00*   (2006.01)
*B81C 1/00*   (2006.01)
*G01L 19/14*  (2006.01)

(52) U.S. Cl.
CPC ........ *B81B 7/0048* (2013.01); *B81C 1/00325* (2013.01); *G01L 19/146* (2013.01);
(Continued)

(58) Field of Classification Search
CPC combination set(s) only.
See application file for complete search history.

(56) References Cited

U.S. PATENT DOCUMENTS

| 6,355,181 B1 | 3/2002 | McQuarrie |
| 2006/0057816 A1* | 3/2006 | Benzel .................. G01L 9/0045 |
| | | 438/424 |

(Continued)

FOREIGN PATENT DOCUMENTS

| DE | 102004006197 A1 | 1/2005 |
| DE | 102015116353 A1 | 5/2016 |

(Continued)

OTHER PUBLICATIONS

International Search Report for PCT/EP2018/053556, dated May 24, 2018.

*Primary Examiner* — Nduka E Ojeh
(74) *Attorney, Agent, or Firm* — Norton Rose Fulbright US LLP; Gerard Messina

(57) ABSTRACT

A method for manufacturing a MEMS unit for a micromechanical pressure sensor. The method includes the steps: providing a MEMS wafer including a silicon substrate and a first cavity formed therein, under a sensor membrane; applying a layered protective element on the MEMS water; and exposing a sensor core from the back side, a second cavity being formed between the sensor core and the surface of the silicon substrate, and the second cavity being formed with the aid of an etching process which is carried out with the aid of etching parameters changed in a defined manner; and removing the layered protective element.

7 Claims, 4 Drawing Sheets

(52) U.S. Cl.
CPC ............ *B81B 2201/0264* (2013.01); *B81B 2203/0127* (2013.01); *B81B 2203/0315* (2013.01); *B81B 2207/012* (2013.01); *B81B 2207/07* (2013.01); *B81C 2201/0132* (2013.01); *B81C 2201/053* (2013.01)

(56) References Cited

U.S. PATENT DOCUMENTS

| | | | |
|---|---|---|---|
| 2014/0224018 A1* | 8/2014 | Whitesides | G01P 15/18 |
| | | | 73/514.33 |
| 2014/0299948 A1* | 10/2014 | Wang | B81B 7/0061 |
| | | | 257/416 |
| 2015/0122038 A1 | 5/2015 | Mayer et al. | |
| 2016/0122181 A1* | 5/2016 | Picco | G01L 9/0054 |
| | | | 257/419 |
| 2017/0064458 A1* | 3/2017 | Chen | B81B 7/0064 |
| 2019/0202687 A1* | 7/2019 | Dannenberg | G01L 19/146 |

FOREIGN PATENT DOCUMENTS

| | | |
|---|---|---|
| JP | 2013156061 A | 8/2013 |
| JP | 2017021010 A | 1/2017 |

\* cited by examiner

METHOD FOR MANUFACTURING A MEMS UNIT FOR A MICROMECHANICAL PRESSURE SENSOR

FIELD

The present invention relates to a method for manufacturing a MEMS unit for a micromechanical pressure sensor. The present invention further relates to a MEMS unit for a micromechanical pressure sensor.

BACKGROUND INFORMATION

Micromechanical pressure sensors, in the case of which a pressure difference is measured as a function of a deformation of a sensor membrane, are described, for example, in German Patent Application No. DE 10 2004 006 197 A1.

Semiconductor resistors, which are utilized in conventional micromechanical pressure sensors as mechanical-electrical transducers, not only absorb the mechanical stress resulting from the effect of pressure onto the membrane, but also stress induced by mechanical interference effects. The two most important interference effects are the following:
- coupled stress on the part of the electronic packaging technology due to:
  - deformation of the circuit board, on which the sensor is mounted
  - deformation of the housing due to temperature, for example, due to soldering
  - temperature behavior of a utilized adhesive; and
- intrinsic stress from the sensor element due to temperature behavior of cover layers.

The aforementioned effects are to be handled, in part, with the aid of a suitable calibration, for example, on the part of the dielectric cover layers. The effect of the metallization and of the stress coupled in on the part of the electronic packaging technology is subject to a considerable dependence on a history of the component (for example, due to metal creep, in particular during/after soldering). This cannot be compensated for by a calibration before delivery of the components.

German Patent Application No. DE 10 2015 116 353 A1 describes a micro-integrated, encapsulated MEMS sensor including mechanical decoupling and a manufacturing method therefor. The pressure sensor manufactured on an SOI substrate is exposed from the back side by etching out the buried oxide layer, for example, with the aid of HF gas-phase etching. The supply of the etching gas takes place through access holes trenched into the silicon of the wafer back side in advance.

SUMMARY

One object of the present invention is to provide a manufacturing method for a MEMS unit of a micromechanical pressure sensor.

The object may be achieved, according to a first aspect of the present invention, by a method for manufacturing a MEMS unit for a micromechanical pressure sensor, including the steps:
- providing a MEMS wafer including a silicon substrate and a first cavity formed therein, under a sensor membrane;
- applying a layered protective element on the MEMS wafer; and
- exposing a sensor core from the back side, a second cavity being formed between the sensor core and the surface of the silicon substrate, and the second cavity being formed with the aid of an etching process which is carried out with the aid of etching parameters changed in a defined manner; and
- removing the layered protective element.

In this way, a stress-decoupled MEMS unit may be advantageously provided with a pressure sensor core. An electronic component (for example, an ASIC) necessary for the micromechanical pressure sensor may be manufactured independently of the MEMS unit in terms of process, where the two aforementioned elements may be assembled in various combinations to form a micromechanical pressure sensor. Advantageously, a large degree of design freedom for the design of the micromechanical pressure sensor is supported as a result.

In the end, a MEMS unit including a pressure sensor membrane exposed on all sides is provided in this way, whereby an efficient stress decoupling structure is implemented. Due to a change in an etching regime, it is possible to provide the second cavity necessary therefor within the silicon substrate. False signals of the micromechanical pressure sensor may be greatly reduced in this way, whereby an operating characteristic of the pressure sensor is improved.

According to a second aspect of the present invention, the object may be achieved by a MEMS unit for a micromechanical pressure sensor, including:
- a sensor core formed in a silicon substrate, including a sensor membrane, a first cavity being formed in the sensor membrane;
- a second cavity formed in the silicon substrate above the sensor core;
- the second cavity being produced with the aid of an etching process, whose etching parameters were changed in a defined manner during the etching process.

Preferred specific embodiments of the example method for manufacturing a micromechanical unit for a micromechanical pressure sensor are described herein.

Advantageous refinements of the example method provide that the layered protective element is a varnish or a foil. In this way, different protective elements may be advantageously utilized for the method. A further advantageous refinement of the method provides that, in order to form the second cavity, the etching process is a reactive ion deep etching process having an anisotropic beginning and a continuation which is isotropic in a defined manner. In this way, etching processes known per se are utilized in an advantageous way for forming the second cavity.

A further advantageous refinement of the example method according to the present invention provides that, in order to form the second cavity with the aid of a vertical etching process, access openings are produced in the silicon substrate, the vertical etching process being changed into a lateral etching process, spherical etch fronts are coalescing resulting from the lateral etching process. As a result, specific properties of conventional etching processes are utilized in an advantageous way in order to provide the second cavity.

A further advantageous refinement of the example method according to the present invention is distinguished by the fact that, after the reactive ion deep etching process, a passivation and sputtering portion of the etching process is switched off. As a result, conventional measures for adapting etching processes are implemented in an effective way in order to create the second cavity.

A further advantageous refinement of the example method according to the present invention provides that the entire etching process is designed to be isotropic in a defined manner from the beginning. In this way, an alternative manufacturing method is advantageously provided.

A further advantageous refinement of the example method according to the present invention provides that downwardly widening, trapezoidal etch fronts are formed from the beginning with the aid of the etching process. In this way, a downwardly formed, trapezoidally widening etching regime is advantageously provided, whereby an introduction of etching gas is advantageously facilitated. In addition, etching times may be reduced as a result and the entire process may be better controlled.

The present invention is described in detail in the following, including further features and advantages, on the basis of multiple figures. Identical or functionally identical elements have identical reference numerals. The figures are intended, in particular, to illustrate the principles essential to the present invention and are not necessarily drawn true to scale. For the sake of greater clarity, it may be provided that not all reference numerals are shown in all the figures.

Described method features similarly result from corresponding described device features, and vice versa. This means, in particular, that features, technical advantages, and comments related to the method for manufacturing a MEMS unit for a micromechanical pressure sensor similarly result from corresponding comments, features, and technical advantages of the MEMS unit and vice versa.

DETAILED DESCRIPTION OF EXAMPLE EMBODIMENTS

A basic concept of the present invention is that of providing a manufacturing method for a MEMS unit of a micromechanical pressure sensor. For this purpose, a specifically designed etching method is provided, which may be carried out using a simple, cost-effective Si substrate. An efficient stress decoupling structure is achieved in this way.

Figure 1:
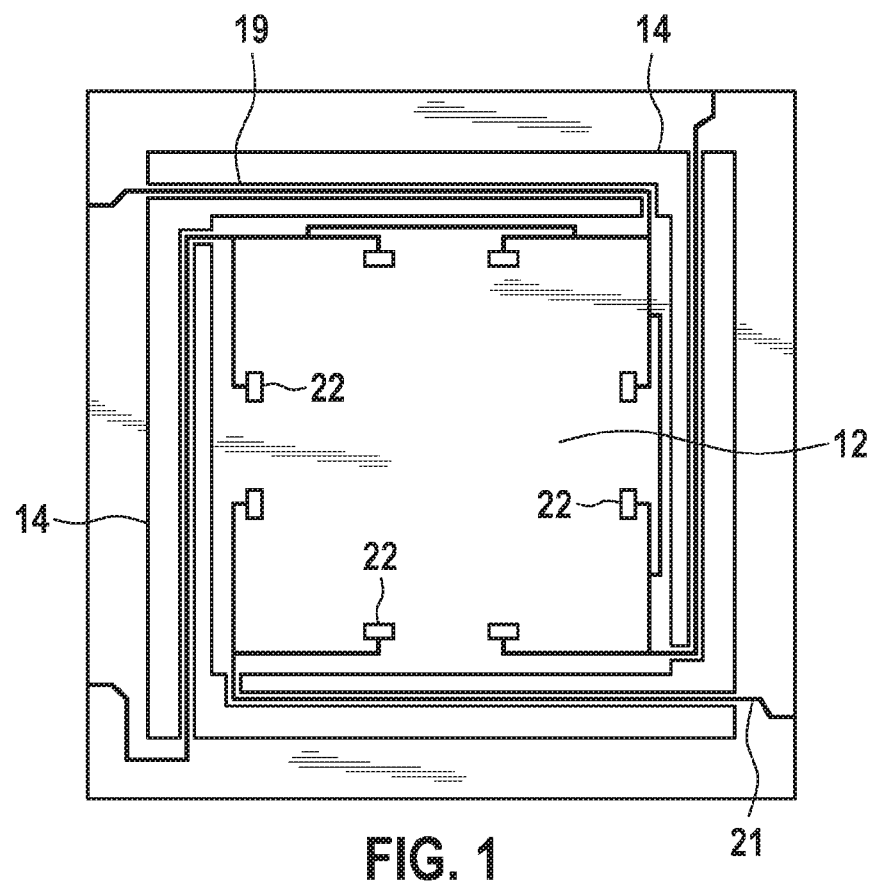
FIG. 1 shows a top view of a sectional view of the provided MEMS unit.

FIG. 1 shows a top view of sensor membrane 12 of MEMS unit 100 and a sectional view through MEMS unit 100. It is apparent that sensor membrane 12 is spaced apart from the remaining substrate by trenches 14, silicon webs in the form of spring elements 19 being formed as a result, which decouple the pressure sensor core from the remaining substrate.

Spring elements 19 are utilized for mechanically fixing and electrically contacting the sensor core to sensor membrane 12. For this purpose, spring elements 19 may be advantageously utilized in order to guide electric strip conductors 21, with the aid of which electrical signals are conducted from piezoelectric resistors 22, which detect a deformation of sensor membrane 12, to an electronic component (not represented).

Figure 2:
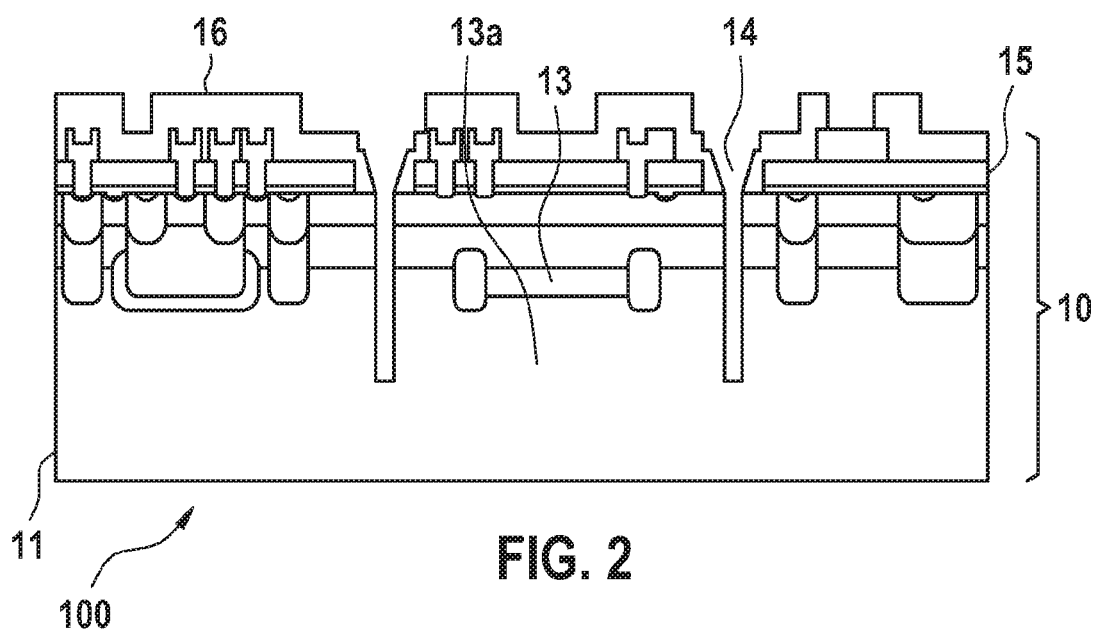
FIGS. 2 through 4 show cross-sectional views explaining the provided method for manufacturing a MEMS unit for a micromechanical pressure sensor.

FIG. 2 shows a cross-sectional view of a MEMS wafer 10 including a silicon substrate 11, on which a dielectric cover layer 15 is situated. First access openings 14 and, furthermore, a first cavity 13 ("vacuum reference cavity") are formed within silicon substrate 11. Bulk silicon 13a is apparent underneath first cavity 13. A layered protective element 20 is applied onto a metallization element 16, as explained with reference to FIG. 3.

Figure 3:
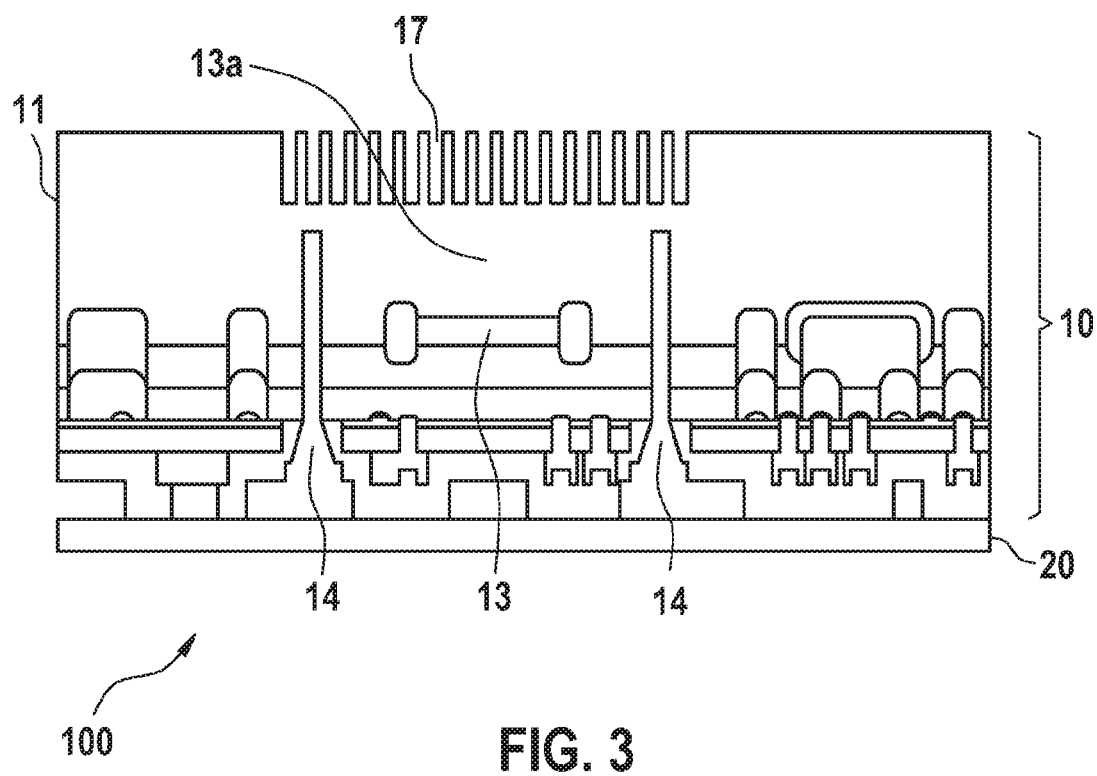

FIG. 3 shows the system from FIG. 2 rotated by 180 degrees, a front side protection in the form of a layered protective element 20 now being applied, preferably adhesively bonded, onto MEMS wafer 10. Layered protective element 20 may be designed as a varnish layer applied onto MEMS wafer 10 or as a foil laminated onto MEMS wafer 10. MEMS wafer 10 is thinned back in this configuration (for example, with the aid of grinding), in order to shorten the processing time in the subsequent structuring step and in order to reduce the component height.

In a subsequent processing step, a hole pattern is produced in silicon substrate 11 with the aid of photolithography. Silicon substrate 11 is etched by utilizing the hole pattern, preferably with the aid of a vertical or anisotropic etching process, preferably in the form of deep reactive ion etching (DRIE). As a result, second access openings 17 are formed in the silicon substrate 11. The etching of second access openings 17 stops in bulk silicon 13a of silicon substrate 11. This structuring step may also be utilized for producing large-area etched holes (not represented) in other areas, which create, for example, an access to bondlands or sawing trenches.

As the sequence proceeds, an underetching is achieved by switching off the passivation and sputtering portion in the aforementioned DRIE etching process, with the aid of an undirected or isotropic further etching on the base of second access openings 17. In this way, a freestanding grid without mechanical contact to the sensor core is produced from an area including blind holes. In this step, a wire bond or sawing trench area may be exposed via etching.

Figure 4:
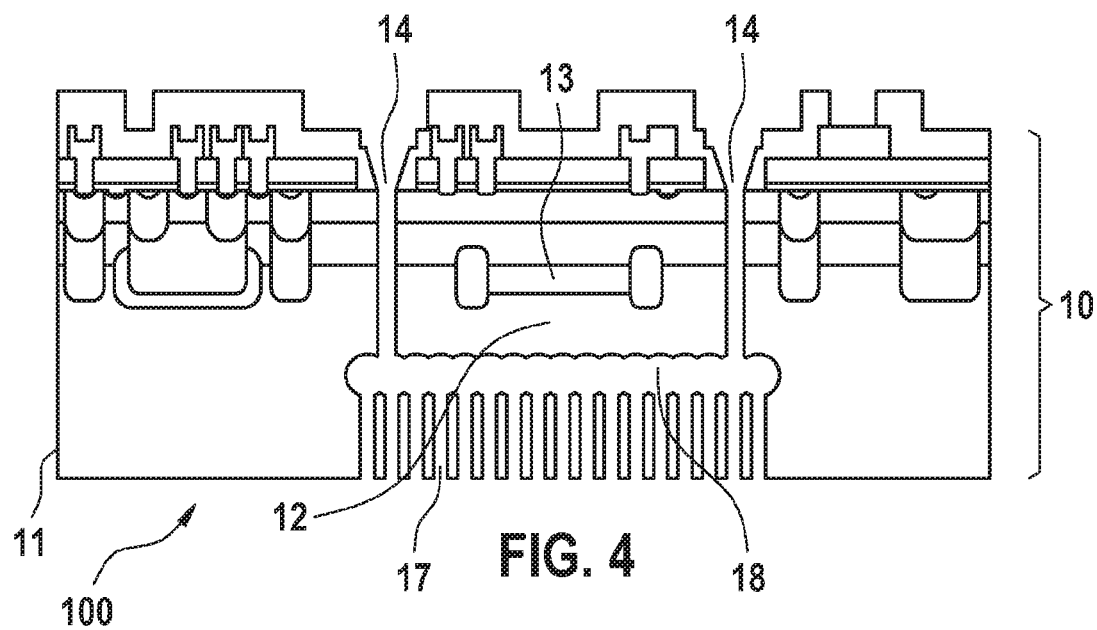

FIG. 4 shows a result of the explained, changed etching regime during the formation of second access openings 17. It is apparent that, due to the changed etching parameters in silicon substrate 11, spherical etch fronts have now coalesced and, in this way, form a second cavity 18. Second cavity 18 is separated from the remaining substrate by a grid, which was formed in silicon substrate 11 by first access openings 17. The pressure sensor core is connected to the remaining substrate in this way with the aid of spring elements 19 (not represented), on which electric strip conductors 21 are guided.

In the end, an all-around exposure and, therefore, a mechanical decoupling structure against externally acting mechanical stress is created with the aid of first access openings 14, which are now continuous, second cavity 18, and continuous second access openings 17 for sensor membrane 12. As a result, apart from electrical accesses and a mechanical fixing of the pressure sensor core, an all-around mechanical decoupling of the pressure sensor core is created, in order to minimize mechanical effects of the chip edge on the pressure sensor core in an advantageous way.

In a simple way, the hollow space, in the form of second cavity 18, which is necessary for the aforementioned structure, has therefore been provided with the aid of an etching process using etching parameters changed during the execution. It is apparent that partially spherical areas are formed within second cavity 18 as a result of the isotropic etching phase.

It is also possible that MEMS unit 100 for a micromechanical pressure sensor 200 is manufactured according to an alternative method. In this case, second access openings 17 having uniformly widening etch fronts are formed, which widen trapezoidally in the downward direction from the surface of silicon substrate 11. This may be achieved in that the aforementioned DRIE process is controlled in such a way that individual etch fronts, which are defined by second access openings 17 on the back side of the substrate, converge during the course of the process and, as a uniform etch front, separate the pressure sensor core from the back side or the top side of the silicon substrate 11 (not represented in the figures).

In the end, second cavity 18 is therefore formed against the surface of silicon substrate 11 and laterally out of the trapezoidal etch fronts. In the end, in this way, etching gases may be more easily introduced and the entire etching process is advantageously well controllable.

FIG. 4 shows the system with layered protective element 20 having been removed as compared to FIG. 3, whereby, in the end, a finished MEMS unit 100 is provided, which may be subsequently combined, for example, with an ASIC 40 or any other type of electronic component to form a micromechanical pressure sensor 200. Advantageously, it is made possible, as a result, for the production process of MEMS unit 100 to be completely separated and disconnected from a production process of ASIC 40. In particular, it is not necessary for a processing of MEMS unit 100 to eutectically bond MEMS wafer 10 to an ASIC wafer.

Figure 5:
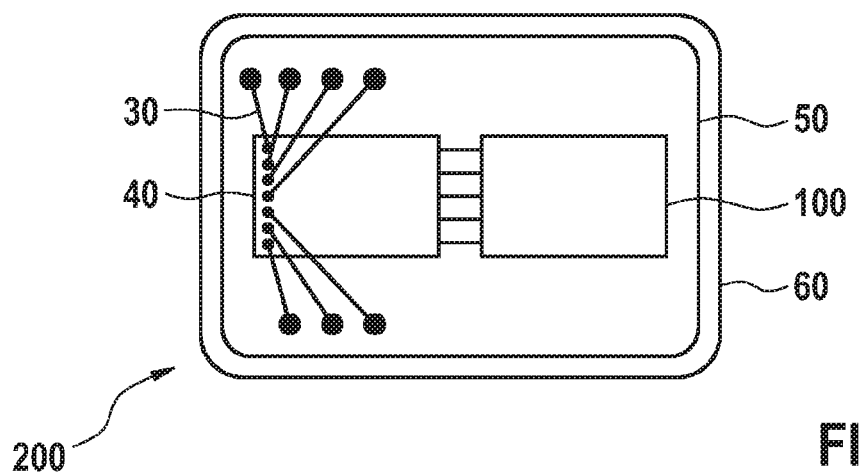
FIG. 5 shows a top view of a micromechanical pressure sensor including the provided MEMS unit.
Figure 6:
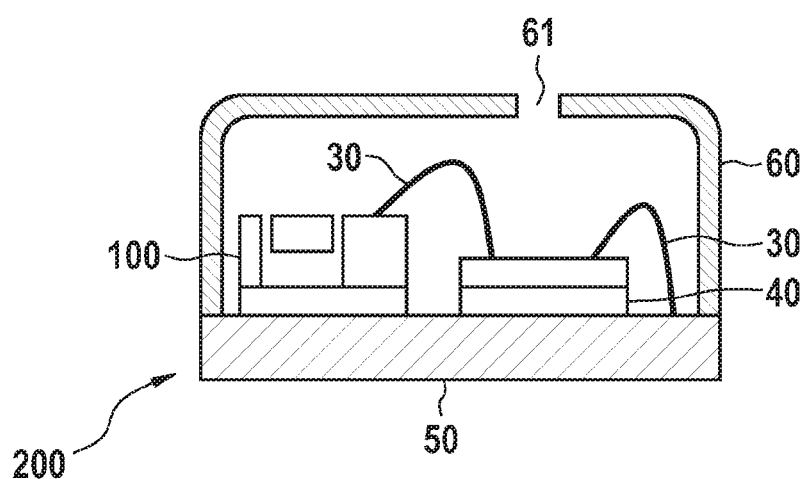
FIGS. 6 through 7 show cross-sectional views through two micromechanical pressure sensors including the provided MEMS unit.
Figure 7:
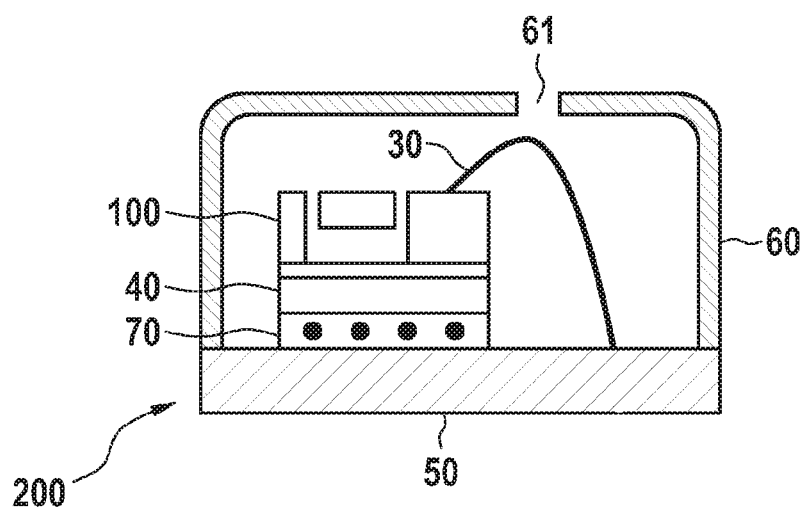

FIGS. 5 through 7 show two variants of micromechanical pressure sensors 200, which are implementable with the aid of provided MEMS unit 100.

FIG. 5 shows a photographic top view of a micromechanical pressure sensor 200, MEMS unit 100 being electrically contacted to an ASIC 40 with the aid of bonding wires 30 in a side-by-side arrangement, both MEMS unit 100 as well as ASIC 40 being situated on a substrate 50. MEMS unit 100 is electrically connected to ASIC 40 with the aid of at least one bonding wire 30 and ASIC 40 is electrically connected to substrate 50 with the aid of at least one bonding wire 30. The entire system is enclosed by a housing 60, in which an access opening 61 is formed, through which a medium for MEMS unit 100 of pressure sensor 200 is suppliable.

FIG. 6 shows micromechanical pressure sensor 200 from FIG. 5 in a cross-sectional view in an orientation rotated by 180 degrees.

FIG. 7 shows a cross-sectional view of a further variant of a micromechanical pressure sensor 200, which is implementable with the aid of provided MEMS unit 100. In this case, MEMS unit 100 is bonded to ASIC 40 in a stacked arrangement, the underside of ASIC 40 including circuit structures being electrically connected to substrate 50 with the aid of a flip-chip connection 70.

In this way, a space-saving variant of micromechanical pressure sensor 200 may be advantageously implemented. In this variant, it is provided that MEMS unit 100 is electrically directly connected to substrate 50 with the aid of at least one bonding wire 30.

Preferably, micromechanical pressure sensor 200 is designed as a piezoresistive pressure sensor, although an implementation as a capacitive micromechanical pressure sensor is also conceivable.

Figure 8:
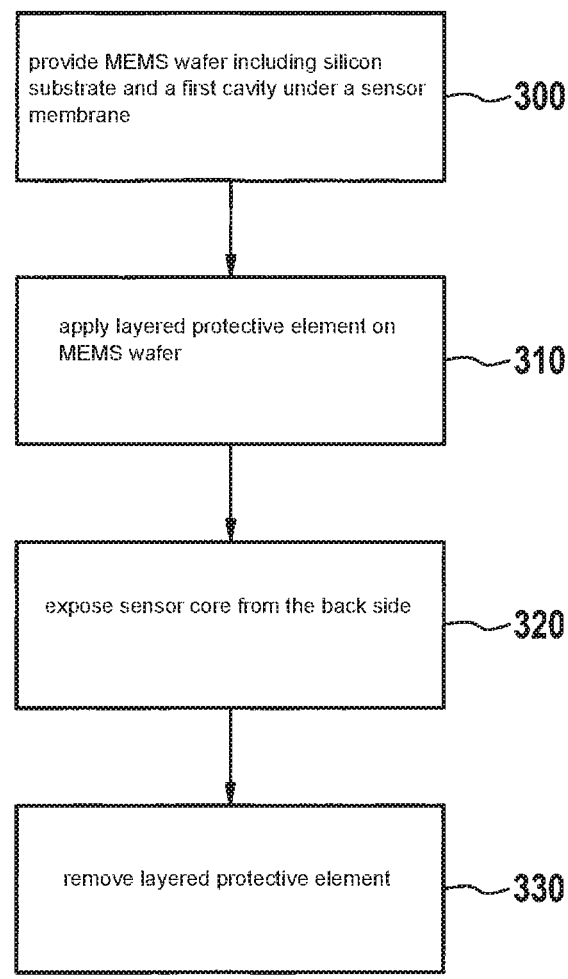
FIG. 8 shows a basic sequence of a specific embodiment of a method for manufacturing a MEMS unit for a micromechanical pressure sensor.

FIG. 8 shows a time sequence of a specific embodiment of the provided method for manufacturing a MEMS unit 100 for a micromechanical pressure sensor 200.

In a step 300, provision of a MEMS wafer 10 including a silicon substrate 11 and a first cavity 13 formed therein, under a sensor membrane 12, is carried out.

In a step 310, an application of a layered protective element 20 on MEMS wafer 10 is carried out.

In a step 320, an exposure of a sensor core 12, 13, 13a from the back side is carried out, a second cavity 18 being formed between sensor core 12, 13, 13a and the surface of silicon substrate 11, second cavity 18 being formed with the aid of an etching process, which is carried out using etching parameters changed in a defined manner.

Finally, in a step 330, layered protective element 20 is removed.

In summary, the present invention provides a method for manufacturing a MEMS unit for a micromechanical pressure sensor, with the aid of which a stress-decoupled pressure detection structure is providable in a cost-effective and flexible way. This is achieved by changing an etching regime during a formation of a second cavity within the first wafer above the pressure sensor membrane, a layered protective element being temporarily applied during the formation of the MEMS unit, whereby the processing of the MEMS unit may be easily carried out.

Due to the decoupling from a second wafer while retaining the pressure sensor membrane exposed on all sides, a plurality of alternative electronic packaging technology methods is provided. In particular, the MEMS unit may be designed independently of a second wafer (for example, an ASIC wafer). Due to the pressure sensor membrane exposed on all sides, the MEMS unit may be more cost-effectively integrated into the electronic packaging technology, for example, with the aid of a hard bonding using a die attach film.

Although the present invention has been described above on the basis of specific exemplary embodiments, those skilled in the art may also implement specific embodiments of the present invention which have not been described or have been only partially described herein, without departing from the scope of the present invention.

What is claimed is:

1. A method for manufacturing a MEMS (micro-electromechanical systems) unit for a micromechanical pressure sensor, comprising:
   providing a MEMS wafer including a silicon substrate and a first cavity formed in the silicon substrate, under a sensor membrane;
   applying a layered protective element on the MEMS wafer;
   exposing a sensor core from a back side, a second cavity being formed between the sensor core and a surface of the silicon substrate, and the second cavity being formed with the aid of an etching process which is carried out with the aid of etching parameters changed during the etching process in a defined manner, the etching process, to form the second cavity, being a reactive ion deep etching process having an anisotropic beginning and a continuation which is isotropic in a defined manner; and
   removing the layered protective element,
   wherein, in order to form the second cavity with the aid of a vertical etching process, access openings are produced in the silicon substrate, the vertical etching process being changed into a lateral etching process, wherein spherical etch fronts coalesce as a result of the lateral etching process, wherein downwardly widening trapezoidal etch fronts are formed with the aid of the etching process, wherein the second cavity is formed against the surface of the silicon substrate and laterally out of the trapezoidal etch fronts.

2. The method as recited in claim 1, wherein the layered protective element is a varnish or a foil.

3. The method as recited in claim 1, wherein, after the reactive ion deep etching process, a passivation and sputtering portion of the etching process is switched off.

4. A MEMS unit for a micromechanical pressure sensor, comprising:
- a sensor core formed in a silicon substrate, including a sensor membrane, a first cavity being formed below the sensor membrane;
- a second cavity formed in the silicon substrate above the sensor core, the second cavity having spherical etch fronts which coalesce to form the second cavity; and
- access openings having uniformly widening etch fronts which widen trapezoidally in a downward direction from a surface of the silicon substrate,
- wherein the second cavity is disposed against the surface of the silicon substrate and laterally out of the trapezoidal etch fronts,
- wherein partially spherical areas are formed within the second cavity.

5. The MEMS unit as recited in claim 4, wherein, in order to form the second cavity, the micromechanical pressure sensor was formed with the aid of a reactive ion deep etching process having an isotropic beginning and a continuation which is isotropic in a defined manner.

6. The MEMS unit as recited in claim 4, wherein a MEMS wafer including the MEMS substrate is connected to an ASIC (application-specific integrated circuit) with the aid of a bonding wire in a side-by-side arrangement or in a stacked arrangement.

7. The MEMS unit as recited in claim 4, wherein the MEMS unit includes piezoresistive or capacitive detection elements.

* * * * *